United States Patent
Lim

(10) Patent No.: US 9,449,658 B2
(45) Date of Patent: Sep. 20, 2016

(54) SEMICONDUCTOR APPARATUS

(71) Applicant: SK hynix Inc., Icheon-si Gyeonggi-do (KR)

(72) Inventor: Hee Joon Lim, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/488,542

(22) Filed: Sep. 17, 2014

(65) Prior Publication Data

US 2015/0364165 A1    Dec. 17, 2015

(30) Foreign Application Priority Data

Jun. 17, 2014 (KR) .................. 10-2014-0073652

(51) Int. Cl.
*G11C 7/10* (2006.01)
*G11C 7/22* (2006.01)

(52) U.S. Cl.
CPC ........... *G11C 7/1048* (2013.01); *G11C 7/1069* (2013.01); *G11C 7/222* (2013.01)

(58) Field of Classification Search
None
See application file for complete search history.

(56) References Cited

U.S. PATENT DOCUMENTS

| | | |
|---|---|---|
| 6,320,806 B1 * | 11/2001 | Han ................... G11C 7/1048 365/189.05 |
| 2015/0213856 A1 * | 7/2015 | Park ................... G11C 7/12 365/203 |

FOREIGN PATENT DOCUMENTS

| | | |
|---|---|---|
| KR | 1020010094720 A | 11/2001 |
| KR | 1020090002489 A | 1/2009 |

* cited by examiner

*Primary Examiner* — James G Norman
(74) *Attorney, Agent, or Firm* — William Park & Associates Ltd.

(57) ABSTRACT

A semiconductor apparatus includes a first memory bank configured to store data transmitted through a first data line; and a precharge block configured to precharge the first data line to a level of a first voltage or a second voltage.

15 Claims, 13 Drawing Sheets

… (1)

SEMICONDUCTOR APPARATUS

CROSS-REFERENCES TO RELATED APPLICATION

The present application claims priority under 35 U.S.C. §119(a) to Korean application number 10-2014-0073652, filed on Jun. 17, 2014, in the Korean Intellectual Property Office, which is incorporated herein by reference in its entirety.

BACKGROUND

1. Technical Field

Various embodiments generally relate to a semiconductor apparatus, and more particularly, to a semiconductor apparatus for precharging a data line.

2. Related Art

Semiconductor apparatuses, specifically, semiconductor memory apparatuses may be used to store data. Semiconductor memory apparatuses may be generally divided into a nonvolatile type and a volatile type.

The nonvolatile memory apparatus may maintain data stored therein even in absence of power supply. For example, nonvolatile memory apparatus may include flash memory, FeRAM (ferroelectric random access memory), PCRAM (phase change random access memory), MRAM (magnetic random access memory), ReRAM (resistive random access memory) and the like.

The volatile memory apparatus cannot maintain data in absence of power supply. The volatile memory apparatus may be generally used as a buffer memory device, a cache memory device, a working memory device, or the like, in a data processing system, based on a relatively high processing speed. Examples of the volatile memory apparatus may include SRAM (static random access memory), DRAM (dynamic random access memory) and the like.

The operation performance of a semiconductor memory apparatus may be determined, based on, for example, a processing speed and a power consumption amount. Therefore, semiconductor memory apparatuses trend to be developed to realize a high processing speed and a small power consumption amount.

SUMMARY

In an embodiment of the invention, a semiconductor apparatus may include a first memory bank configured to store data transmitted through a first data line and a precharge block configured to precharge the first data line to a level of a first voltage or a second voltage.

In an embodiment of the invention, a semiconductor apparatus may include a first memory bank configured to store data transmitted through a first data line and a precharge block configured to not supply a voltage or supply a first voltage to the first data line based on a write signal.

DETAILED DESCRIPTION

Hereinafter, a semiconductor apparatus will be described below with reference to accompanying drawings through various examples of embodiments.

Figure 1:
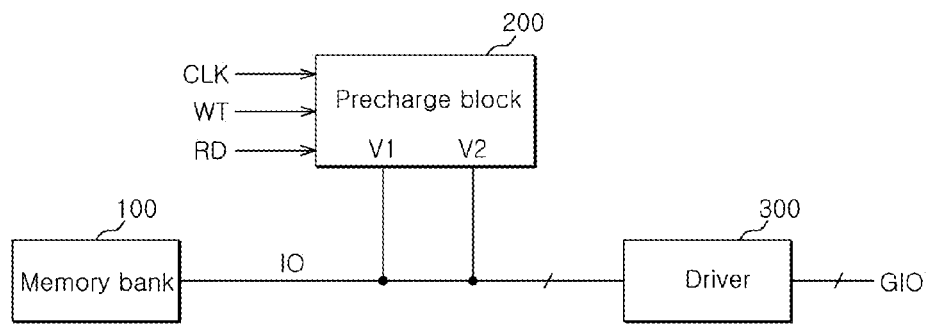
FIG. 1 is a block diagram schematically showing a semiconductor apparatus in accordance with an embodiment.

Referring to FIG. 1, a block diagram schematically showing a semiconductor apparatus 10 in accordance with an embodiment is shown.

The semiconductor apparatus 10 may include a memory bank 100 configured to store data transmitted through at least one data line IO. The semiconductor apparatus 10 may also include a precharge block 200 configured to precharge the at least one data line IO to the level of a first voltage V1 or the level of a second voltage V2.

The memory bank 100 may be electrically coupled with the at least one data line IO for transmitting data. The memory bank 100 may include a memory cell array configured by a plurality of memory cells.

The precharge block 200 may precharge the at least one data line IO, based on a clock signal CLK, a write signal WT and a read signal RD. The precharge block 200 may retain the at least one data line IO at a predetermined voltage level during a period in which the at least one data line IO does not transmit data. The write signal WT may be a signal generated in the semiconductor apparatus 10 in response to a write command provided from an external device. Where the enable period of the write signal WT is generated, data may be written in the memory bank 100. The read signal RD may be a signal generated in the semiconductor apparatus 10 in response to a read command provided from an external device. Where the enable period of the read signal RD is generated, data may be read from the memory bank 100.

The precharge block 200 may not supply a voltage or supply the first voltage V1 to the at least one data line IO, based on the write signal WT. The precharge block 200 may monitor whether write operations are continuously performed for the memory bank 100, by referring to the write signal WT and may not supply or supply a voltage to the at least one data line IO.

More specifically, the precharge block 200 may not supply a voltage to the at least one data line IO, based on a first enable period of the write signal WT. The precharge block 200 may continuously not supply a voltage to the at least one data line IO where a second enable period of the write signal WT is generated within a predetermined time from after the first enable period of the write signal WT is generated. The precharge block 200 may supply the first voltage V1 to the at least one data line IO where the second enable period is not generated.

The precharge block 200 may continuously monitor whether a subsequent enable period is generated even after the second enable period is generated, and may not supply a voltage or supply the first voltage V1 to the at least one data line IO.

The precharge block 200 may supply the second voltage V2 to the at least one data line IO based on the read signal RD. The level of the second voltage V2 may be higher than the level of the first voltage V1. The second voltage V2 may be a core voltage supplied to the core region of the semiconductor apparatus 10.

The semiconductor apparatus 10 may further include a driver 300 configured to transmit data transmitted through at least one upper data line GIO, to the at least one data line IO. The driver 300 may transmit data to the at least one data line IO to which the supply of a voltage by the precharge block 200 is interrupted.

Figure 2:
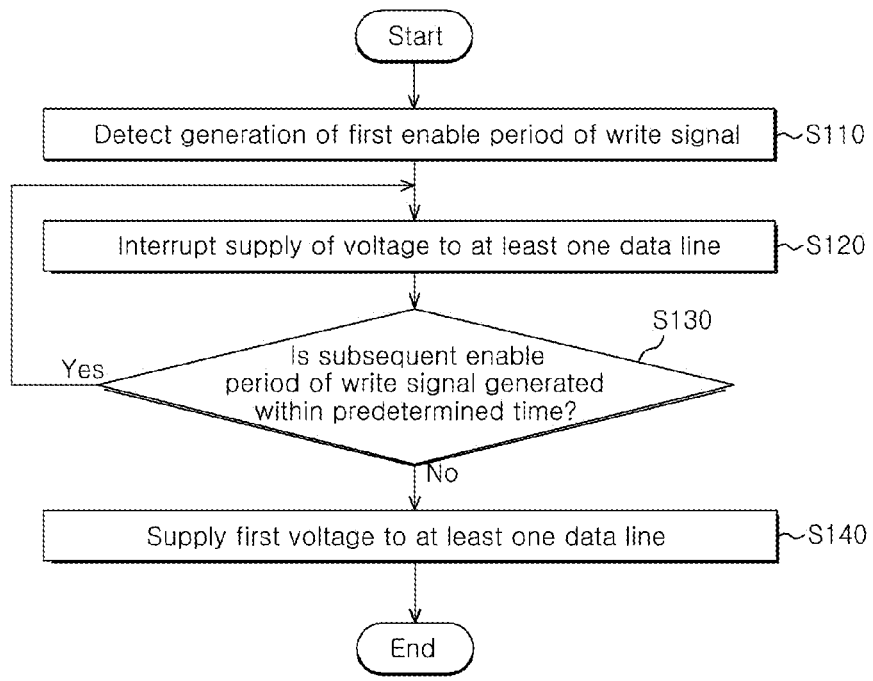
FIGS. 2 and 3 are flow charts briefly explaining the operations of the precharge block shown in FIG. 1.
Figure 3:
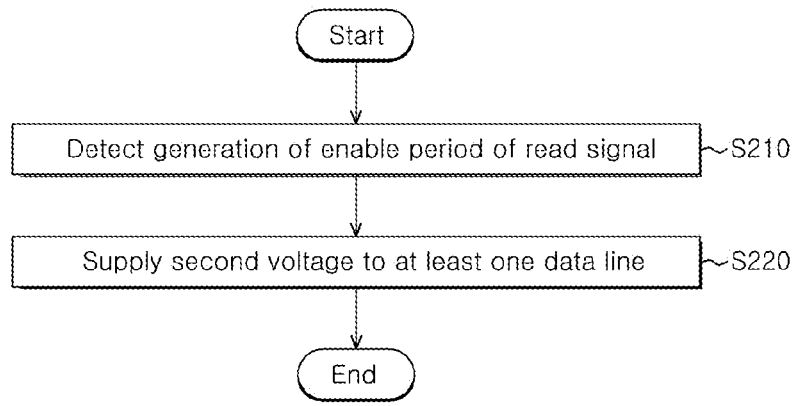

Referring to FIGS. 2 and 3, flow charts briefly explaining the operations of the precharge block 200 shown in FIG. 1 are illustrated.

FIG. 2 shows the operations of the precharge block 200 when the enable period of the write signal WT is generated.

In step S110, the precharge block 200 may detect the generation of a first enable period of the write signal WT.

In step S120, the precharge block 200 may not supply a voltage to the at least one data line IO. Thereafter, data may be transmitted through the at least one data line IO. In addition, transmitted data may be written in the memory bank 100.

In step S130, the precharge block 200 may monitor whether a subsequent enable period of the write signal WT is generated within a predetermined time from when the first enable period is generated.

Where a subsequent enable period of the write signal WT is generated within the predetermined time from when the first enable period is generated (Yes), the process may proceed to the step S120. More specifically, to allow next data to be transmitted, the precharge block 200 may continuously not supply a voltage to the at least one data line IO. In the step S130, the precharge block 200 may continuously monitor whether a subsequent enable period of the write signal WT is generated.

Where a subsequent enable period of the write signal WT is not generated within the predetermined time from when the first enable period is generated (No), the process may proceed to step S140.

In the step S140, the precharge block 200 may supply the first voltage V1 to the at least one data line IO.

The process of FIG. 2 may be repeated in the same manner where it is determined in the step S130 that a subsequent enable period of the write signal WT is not generated within the predetermined time from when the first enable period is generated and is generated after the predetermined time. More specifically, since it is determined in the step S130 that a subsequent enable period is not generated within the predetermined time, the process may proceed to the step S140. Then, a subsequent enable period of the write signal WT, generated after the predetermined time, corresponds to the first enable period in the step S110, and in this state, the process will proceed.

FIG. 3 shows the operations of the precharge block 200 when the enable period of the read signal RD is generated. For example, the process shown in FIG. 3 may be performed following the process of FIG. 2. In this case, before step S210 starts, the at least one data line IO may be in a state in which it is precharged to the level of the first voltage V1.

In the step S210, the precharge block 200 may detect the generation of an enable period of the read signal RD.

In step S220, the precharge block 200 may supply the second voltage V2 to the at least one data line IO. Thereafter, through the at least one data line IO precharged to the level of the second voltage V2, data may be read from the memory bank 100 by charge sharing.

The semiconductor apparatus 10 according to the embodiment shown in FIGS. 1 to 3 may continuously interrupt supply of a voltage to the at least one data line IO where write commands are consecutively provided from an external device, whereby current consumption may be reduced. The semiconductor apparatus 10 may precharge the at least one data line IO to the level of the first voltage V1 where write commands are not consecutively provided from an external device, whereby a drop in a voltage level by current leakage may be prevented. The semiconductor apparatus 10 may precharge the at least one data line IO to the level of the second voltage V2 where a read command is provided from an external device, and may be transmitted with data from the memory bank 100 by charge sharing.

Figure 4:
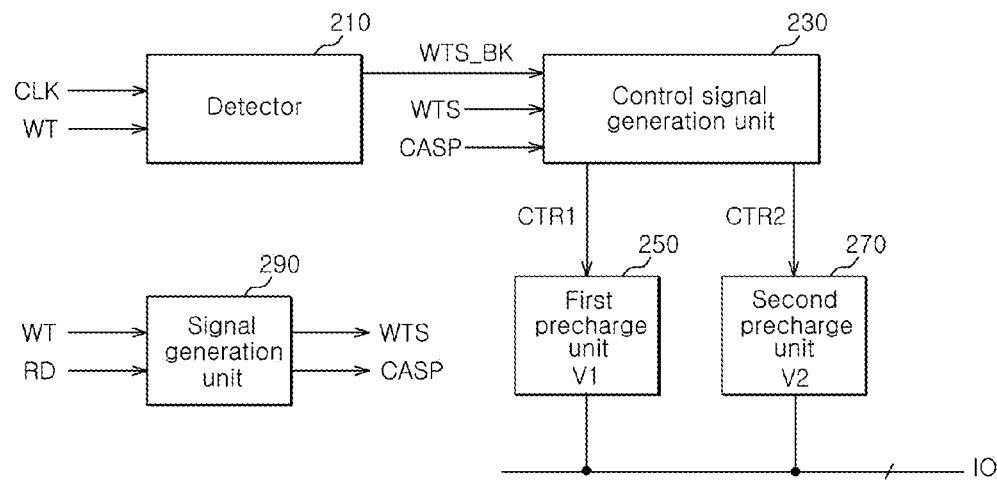
FIG. 4 is a block diagram schematically showing the precharge block shown in FIG. 1.

Referring to FIG. 4, a block diagram schematically showing the precharge block 200 shown in FIG. 1 is illustrated.

The precharge block 200 may include a detector 210, a control signal generation unit 230, a first precharge unit 250, a second precharge unit 270, and a signal generation unit 290.

The detector 210 may monitor whether write operations are continuously performed. The detector 210 may monitor whether a first enable period and a second enable period of the write signal WT have been generated. The detector 210 may monitor whether the second enable period of the write signal WT is generated within a predetermined time after the first enable period of the write signal WT is generated. The predetermined time may be a time defined as the specification of the semiconductor apparatus 10. The predetermined time may also be a time that passes from a time when the write signal WT is enabled to a time when the write signal WT is next enabled.

The detector 210 may be inputted with the clock signal CLK and the write signal WT, and may output a write detection signal WTS_BK as a monitoring result. In particular, the detector 210 may enable the write detection signal WTS_BK when the write signal WT is enabled. The detector 210 may continuously enable the write detection signal WTS_BK if the write signal WT is enabled again within the predetermined time from when the write signal WT is enabled. The detector 210 may disable the write detection signal WTS_BK if the write signal WT is not enabled again within the predetermined time from when the write signal WT is enabled.

The control signal generation unit 230 may output a first control signal CTR1 and a second control signal CTR2 in response to the write detection signal WTS_BK, a write strobe signal WTS and a column enable signal CASP. The write strobe signal WTS may be generated by the signal generation unit 290 such that it is enabled when the write signal WT is enabled and is disabled when the read signal RD is enabled. The column enable signal CASP may be a signal enabled to access the memory bank 100, and may be generated by delaying the write signal WT or the read signal RD by the signal generation unit 290.

The control signal generation unit 230 may output the second control signal CTR2 which is disabled in response to the write strobe signal WTS which is enabled. Further, the control signal generation unit 230 may output the second control signal CTR2 which is enabled, in response to the write strobe signal WTS which is disabled. The control signal generation unit 230 may output the first control signal CTR1 which is disabled, in response to the write detection signal WTS_BK which is enabled. In addition, the control signal generation unit 230 may output the first control signal CTR1 which is enabled, in response to the write detection signal WTS_BK which is disabled. The control signal generation unit 230 may output the first and second control signals CTR1 and CTR2 which are disabled, in response to the column enable signal CASP which is enabled.

The first precharge unit 250 may supply the first voltage V1 to the at least one data line IO in response to the first control signal CTR1.

The second precharge unit 270 may supply the second voltage V2 to the at least one data line IO in response to the second control signal CTR2.

Figure 5:
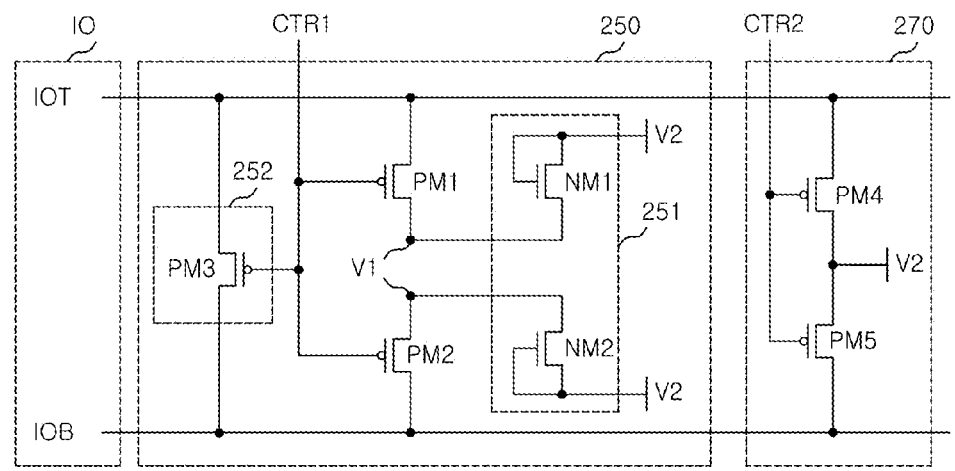
FIG. 5 is a circuit diagram showing in detail the first precharge unit and the second precharge unit shown in FIG. 4.

Referring to FIG. 5, a circuit diagram showing in detail the first precharge unit 250 and the second precharge unit 270 shown in FIG. 4 is shown. In FIG. 5, the at least one data line IO may include a data line IOT and a data line bar IOB. In this instance, the semiconductor apparatus 10 may transmit signals in a differential scheme. In the following descriptions, the first control signal CTR1 and the second control signal CTR2 may be enabled to a logic low.

The first precharge unit 250 may supply the first voltage V1 to the at least one data line IO in response to the first control signal CTR1 which is enabled. The first precharge unit 250 may include a voltage dropping section 251, first and second PMOS transistors PM1 and PM2, and an equalizer 252.

The voltage dropping section 251 may be applied with the second voltage V2 and output the first voltage V1. The voltage dropping section 251 may include first and second NMOS transistors NM1 and NM2. Each of the first and second NMOS transistors NM1 and NM2 may be configured such that the drain is electrically coupled to a supply node of the second voltage V2 and the gate is electrically coupled to the drain.

The first and second PMOS transistors PM1 and PM2 may supply the first voltage V1 outputted from the voltage dropping section 251, to the at least one data line IO, in response to the first control signal CTR1. The first PMOS transistor PM1 may be configured in such that the source is electrically coupled to the source of the first NMOS transistor NM1, the drain is electrically coupled to the data line IOT and the gate is applied with the first control signal CTR1. The second PMOS transistor PM2 may be configured such that the source electrically coupled to the source of the second NMOS transistor NM2, the drain is electrically coupled to the data line bar IOB and the gate is applied with the first control signal CTR1.

The equalizer 252 may equalize the data line IOT and the data line bar IOB in response to the first control signal CTR1. The equalizer 252 may include a third PMOS transistor PM3. The third PMOS transistor PM3 may be configured such that the source is electrically coupled to the data line IOT, the drain is electrically coupled to the data line bar IOB and the gate is applied with the first control signal CTR1.

The second precharge unit 270 may supply the second voltage V2 to the at least one data line IO in response to the second control signal CTR2 which is enabled. The second precharge unit 270 may include fourth and fifth PMOS transistors PM4 and PM5. The fourth PMOS transistor PM4 may be configured such that the source is electrically coupled to the supply node of the second voltage V2, the drain is electrically coupled to the data line IOT and the gate is applied with the second control signal CTR2. The fifth PMOS transistor PM5 may be configured such that the source is electrically coupled to the supply node of the second voltage V2, the drain is electrically coupled to the data line bar IOB and the gate is applied with the second control signal CTR2.

Figure 6:
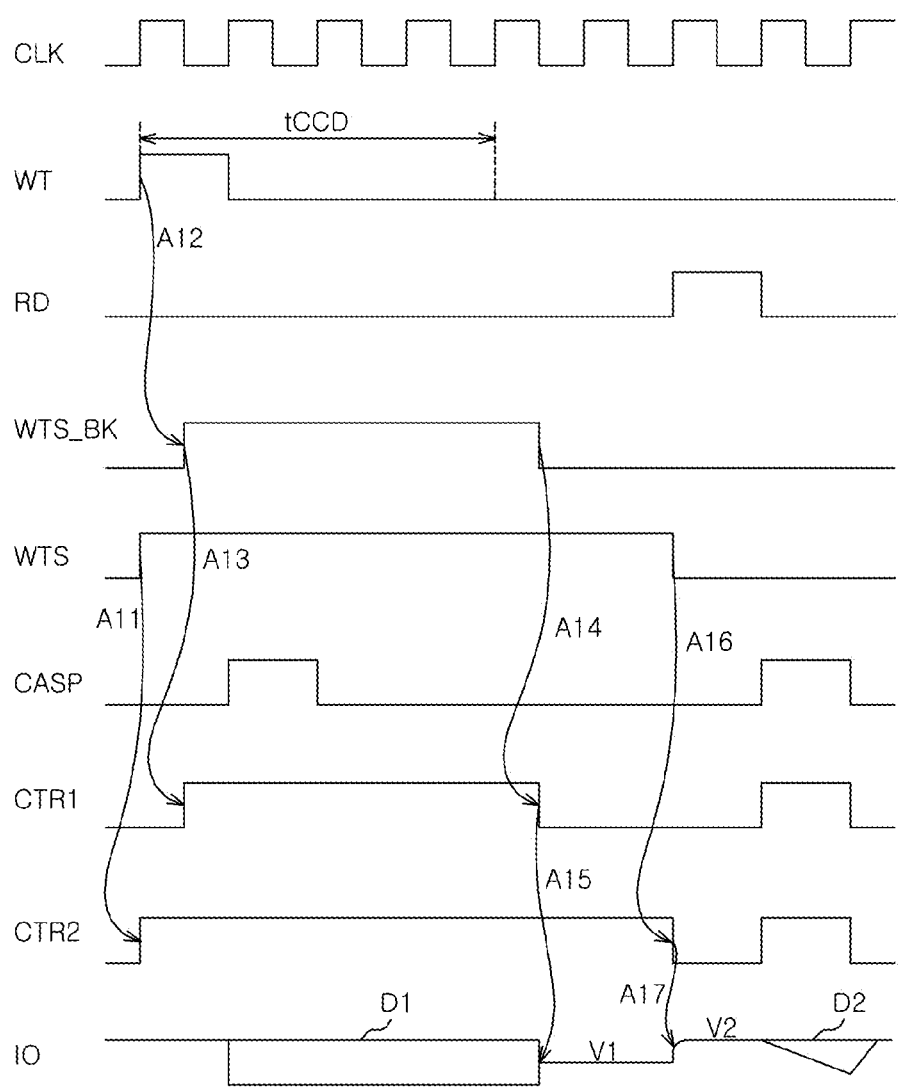
FIG. 6 is a timing diagram explaining the operation method of the semiconductor apparatus shown in FIG. 1.

Referring to FIG. 6, a timing diagram explaining the operation method of the semiconductor apparatus 10 shown in FIG. 1 is illustrated.

Hereinbelow, the operation method of the semiconductor apparatus 10 will be described in detail with reference to FIGS. 1 to 6.

The control signal generation unit 230 may disable the second control signal CTR2 in response to the write strobe signal WTS enabled as the write signal WT is enabled (A11). The second precharge unit 270 may not supply the second voltage V2 to the at least one data line IO, in response to the disabled second control signal CTR2.

The detector 210 may detect the enabled write signal WT and enable the write detection signal WTS_BK (A12). The control signal generation unit 230 may disable the first control signal CTR1 in response to the enabled write detection signal WTS_BK (A13). The first precharge unit 250 may not supply the first voltage V1 to the at least one data line IO, in response to the disabled first control signal CTR1.

The column enable signal CASP may be enabled, and data D1 may be transmitted through the at least one data line IO and be stored in the memory bank 100.

The detector 210 may disable the write detection signal WTS_BK if the write signal WT is not enabled again within a predetermined time tCCD from when the write signal WT is enabled. FIG. 6 illustrates where the predetermined time tCCD for which the detector 210 monitors the write signal WT is set to 4 cycles of the clock signal CLK.

The control signal generation unit 230 may enable the first control signal CTR1 in response to the disabled write detection signal WTS_BK (A14). The first precharge unit 250 may supply the first voltage V1 to the at least one data line IO in response to the enabled first control signal CTR1 (A15). As the first precharge unit 250 slightly precharges the at least one data line IO to the level of the first voltage V1, a drop in a voltage level by current leakage may be prevented accordingly.

The control signal generation unit 230 may enable the second control signal CTR2 in response to the write strobe signal WTS disabled as the read signal RD is enabled (A16). The second precharge unit 270 may supply the second voltage V2 to the at least one data line IO in response to the enabled second control signal CTR2 (A17). The second precharge unit 270 may quickly precharge the at least one data line IO which has already been precharged to the level of the first voltage V1, to the level of the second voltage V2.

The control signal generation unit 230 may disable the first and second control signals CTR1 and CTR2 in response to the column enable signal CASP which is enabled. The at least one data line IO which is precharged to the level of the second voltage V2 may be transmitted with data D2 from the memory bank 100 by charge sharing.

Figure 7:
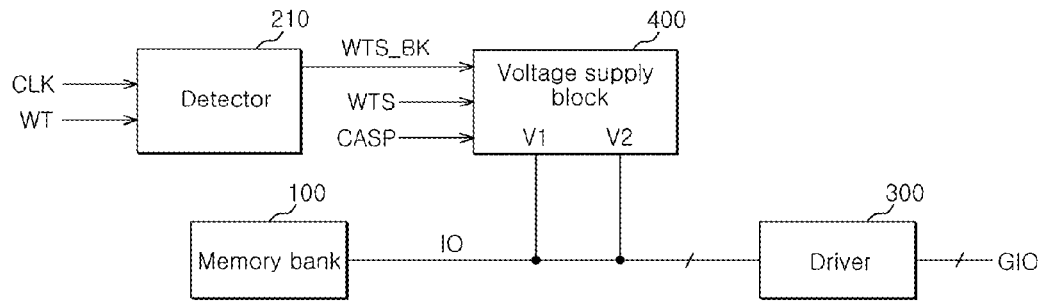
FIG. 7 is a block diagram schematically showing a semiconductor apparatus in accordance with an embodiment.

Referring to FIG. 7, a block diagram schematically showing a semiconductor apparatus 20 in accordance with an embodiment is illustrated.

In FIG. 7, the same reference numerals as in FIGS. 1 and 4 will be used to refer to substantially the same component elements as the component elements of the semiconductor apparatus 10 and the precharge block 200 described above with reference to FIGS. 1 and 4. Accordingly detailed descriptions for the corresponding component elements will be omitted.

The semiconductor apparatus 20 may include a memory bank 100, a detector 210, a voltage supply block 400, and a driver 300.

The voltage supply block 400 may precharge at least one data line IO to the level of a first voltage V1 or a second voltage V2, in response to a write detection signal WTS_BK, a write strobe signal WTS and a column enable signal CASP.

More specifically, the voltage supply block 400 may not supply the second voltage V2 in response to the write strobe signal WTS which is enabled. Further, the voltage supply block 400 may supply the second voltage V2 in response to the write strobe signal WTS which is disabled. The voltage supply block 400 may not supply the first voltage V1 in response to the write detection signal WTS_BK which is enabled. In addition, the voltage supply block 400 may supply the first voltage V1 in response to the write detection signal WTS_BK which is disabled. The voltage supply block 400 may not supply both the first and second voltages V1 and V2 in response to the column enable signal CASP which is enabled.

The voltage supply block 400 may include, for example, the signal generation unit 230 and the first and second precharge units 250 and 270 of FIG. 4.

Although not shown, the semiconductor apparatus 20 may further include a signal generation unit for generating the write strobe signal WTS and the column enable signal CASP based on the write signal WT and a read signal.

The operation method of the semiconductor apparatus 20 may be substantially similar to the operation method of the semiconductor apparatus 10 described above with reference to FIGS. 1 to 6.

Figure 8:
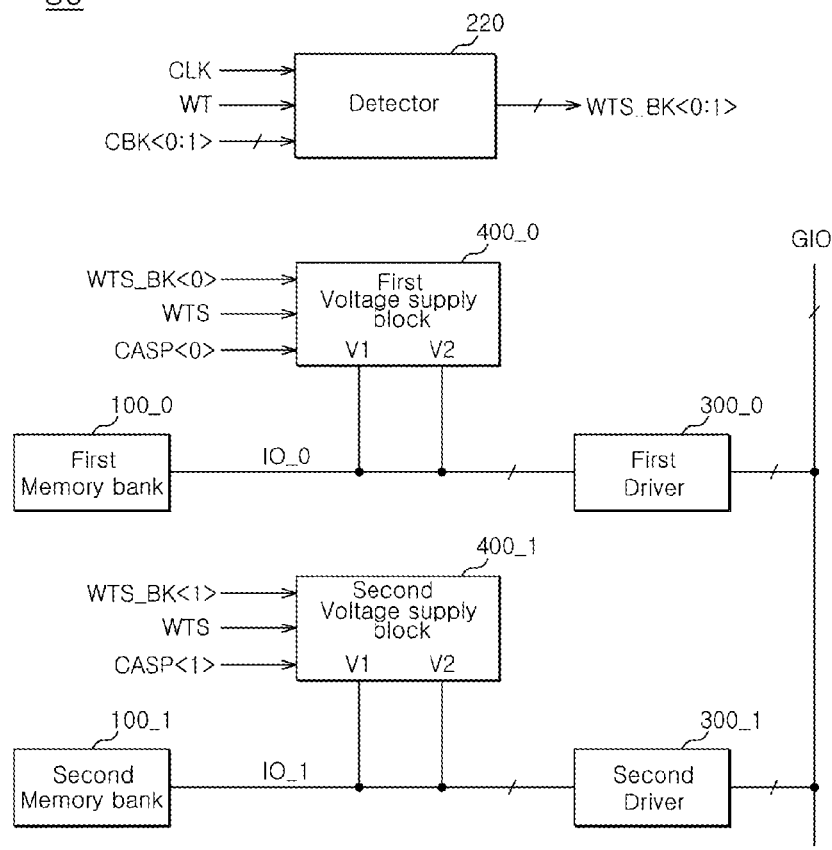
FIG. 8 is a block diagram schematically showing a semiconductor apparatus in accordance with an embodiment.

Referring to FIG. 8, a block diagram schematically showing a semiconductor apparatus 30 in accordance with an embodiment is shown.

The semiconductor apparatus 30 may include first and second memory banks 100_0 and 100_1, a detector 220, first and second voltage supply blocks 400_0 and 400_1, and first and second drivers 300_0 and 300_1.

Each of the memory banks 100_0 and 100_1 may be accessed in a write operation or a read operation. The memory banks 100_0 and 100_1 may be afforded with corresponding bank addresses for identification. The memory banks 100_0 and 100_1 may be respectively accessed, based on the bank addresses provided along with a command from an external device in the write or read operation. The memory banks 100_0 and 100_1 may be electrically coupled with corresponding data lines IO_0 and IO_1, respectively.

The detector 220 may be inputted with a clock signal CLK, a write signal WT, and bank addresses CBK<0:1>. The detector 220 may monitor for which memory bank the enable periods of the write signal WT are consecutively generated, that is, for which memory bank write operations are continuously performed, by referring to the bank addresses CBK<0:1>. The detector 220 may output a monitoring result as write detection signal WTS_BK<0:1> respectively corresponding to the first and second voltage supply blocks 400_0 and 400_1. For instance, an assumption is made where write operations are continuously performed for the first memory bank 100_0. In this case, the detector 220 may detect consecutive generation of the enable periods of the write signal WT, and at the same time, may be inputted with the enabled first bank address CBK<0> corresponding to the first memory bank 100_0. The detector 220 may output the enabled first write detection signal WTS_BK<0> to the first voltage supply block 400_0 according to a monitoring result.

The voltage supply blocks 400_0 and 400_1 and the drivers 300_0 and 300_1 may be configured and operate in substantially the same way as the voltage supply block 400 and the driver 300 of FIG. 7. Accordingly, detailed descriptions will be omitted as a result.

Figure 9:
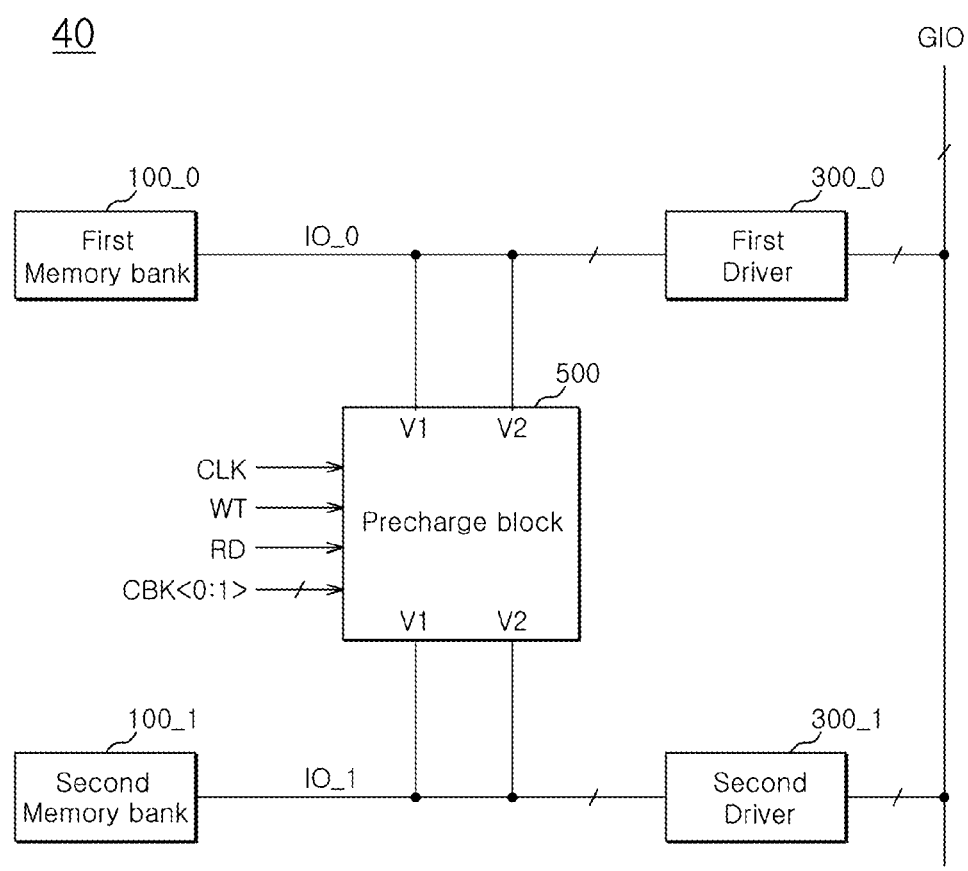
FIG. 9 is a block diagram schematically showing a semiconductor apparatus in accordance with an embodiment.

Referring to FIG. 9, a block diagram schematically showing a semiconductor apparatus 40 in accordance with an embodiment is shown.

The semiconductor apparatus 40 may include a first memory bank 100_0, a second memory bank 100_1, a precharge block 500, a first driver 300_0, and a second driver 300_1.

The memory banks 100_0 and 100_1 may be respectively accessed, based on the bank addresses respectively corresponding to them, in a write or read operation. The memory banks 100_0 and 100_1 may be electrically coupled with corresponding data lines IO_0 and IO_1, respectively.

The precharge block 500 may precharge the data lines IO_0 and IO_1 to the level of a first voltage V1 or the level of a second voltage V2, based on a clock signal CLK, a write signal WT, a read signal RD and bank addresses CBK<0:1>. The precharge block 500 may monitor whether write operations are continuously performed for at least one of the memory banks 100_0 and 100_1. The precharge block 500 may then supply or not supply a voltage to the data lines IO_0 and IO_1. The precharge block 500 may control substantially simultaneously supply of a voltage to the data lines IO_0 and IO_1 according to a monitoring result.

In detail, the precharge block 500 may not supply a voltage to the data lines IO_0 and IO_1, based on a first enable period of the write signal WT. The first enable period of the write signal WT may be generated for one of the memory banks 100_0 and 100_1.

The precharge block 500 may continuously not supply a voltage to the data lines IO_0 and IO_1 where a second enable period of the write signal WT is generated within a predetermined time from after the first enable period of the write signal WT is generated. Further, the precharge block 500 may supply the first voltage V1 to the data lines IO_0 and IO_1 where the second enable period is not generated. The second enable period of the write signal WT may be generated for one of the memory banks 100_0 and 100_1, for example, the second memory bank 100_1.

The precharge block 500 may continuously monitor whether a subsequent enable period is generated even after the second enable period is generated, and may not supply a voltage or supply the first voltage V1 to the data lines IO_0 and IO_1.

The drivers 300_0 and 300_1 may be configured and operate in substantially the way as the driver 300 of FIG. 1. Accordingly, detailed descriptions will be omitted as a result.

Figure 10:
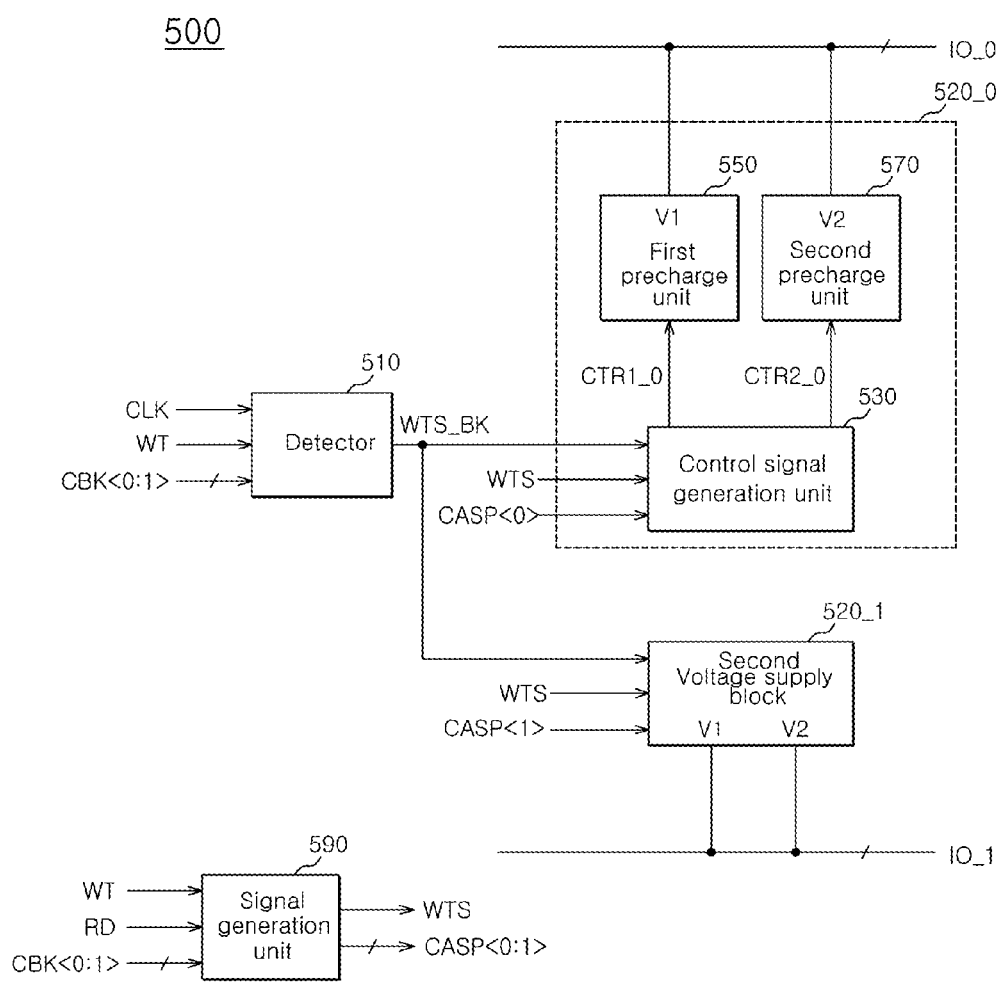
FIG. 10 is a block diagram schematically showing the precharge block shown in FIG. 9.

Referring to FIG. 10, a block diagram schematically showing the precharge block 500 shown in FIG. 9 is illustrated.

The precharge block 500 may include a detector 510, a first voltage supply block 520_0, a second voltage supply block 520_1, and a signal generation unit 590.

The detector 510 may be inputted with the clock signal CLK, the write signal WT, and the bank addresses CBK<0:1>. The detector 510 may monitor whether write or read operations are continuously performed for the memory banks 100_0 and 100_1, by referring to the bank addresses CBK<0:1>. In addition, the detector 510 may output a monitoring result as a write detection signal WTS_BK. The detector 510 may enable the write detection signal WTS_BK if an enable period of the write signal WT is generated for the first memory bank 100_0 or the second memory bank 100_1.

The first voltage supply block 520_0 may precharge the first data line IO_0 to the level of the first voltage V1 or the second voltage V2 in response to the write detection signal WTS_BK, a write strobe signal WTS and a first column enable signal CASP<0>. The first column enable signal CASP<0> may be a signal enabled to access the first memory bank 100_0.

The second voltage supply block 520_1 may precharge the second data line IO_1 to the level of the first voltage V1 or the second voltage V2 in response to the write detection signal WTS_BK, the write strobe signal WTS and a second column enable signal CASP<1>. The second column enable signal CASP<1> may be a signal enabled to access the second memory bank 100_1.

Because the first and second voltage supply blocks 520_0 and 520_1 are controlled by the common write detection signal WTS_BK, supply of a voltage to the first and second data lines IO_0 and IO_1 may be controlled substantially simultaneously.

The first voltage supply block 520_0 may include a control signal generation unit 530, and first and second precharge units 550 and 570. The first and second precharge units 550 and 570 may supply the first and second voltages V1 and V2, respectively, to the first data line IO_0 in response to first and second control signals CTR1_0 and CTR2_0, respectively, which are generated by the control signal generation unit 530. The control signal generation unit 530 and the first and second precharge units 550 and 570 may be configured and operate in substantially the same way as the control signal generation unit 230 and the first and second precharge units 250 and 270 shown in FIG. 4. Accordingly, detailed descriptions will be omitted as a result.

The second voltage supply block 520_1 may be configured and operate in substantially the same way as the first voltage supply block 520_0. Accordingly, detailed descriptions will be omitted.

The signal generation unit 590 may generate the write strobe signal WTS and the column enable signals CASP<0:1> in response to the write signal WT, the read signal RD and the bank addresses CBK<0:1>.

Figure 11:
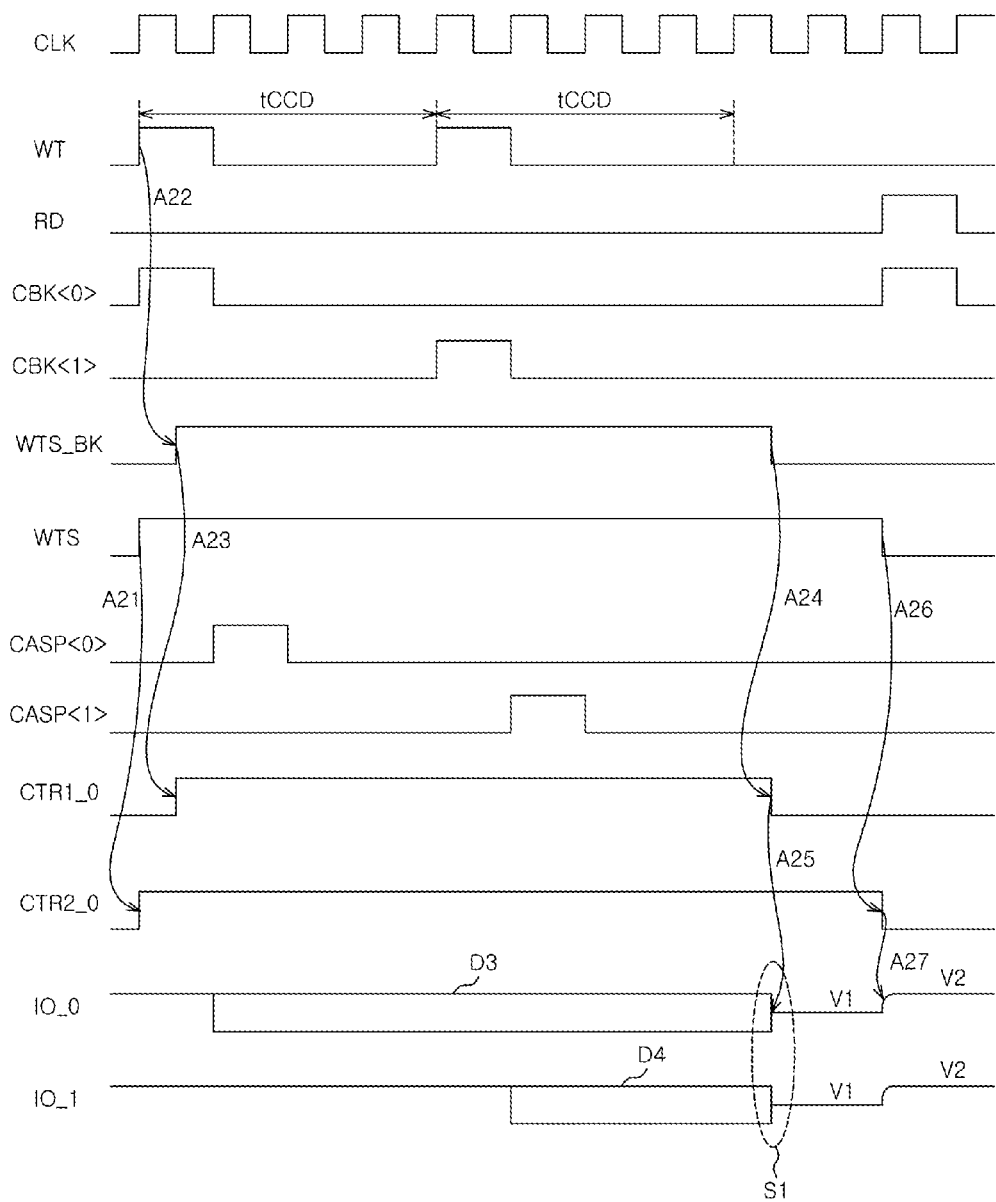
FIG. 11 is a timing diagram explaining the operation method of the semiconductor apparatus shown in FIG. 9.

Referring to FIG. 11, a timing diagram explaining the operation method of the semiconductor apparatus 40 shown in FIG. 9 is illustrated.

Hereinbelow, the operation method of the semiconductor apparatus 40 will be described in detail with reference to FIGS. 9 to 11. The operation method of the first voltage supply block 520_0 will be described preferentially. In addition, the operation method of the second voltage supply block 520_1 may be substantially similar to the operation method of the first voltage supply block 520_0.

The control signal generation unit 530 of the first voltage supply block 520_0 may disable the second control signal CTR2_0 in response to the write strobe signal WTS enabled as the write signal WT is enabled (A21). The second precharge unit 570 may not supply the second voltage V2 to the first data line IO_0 in response to the disabled second control signal CTR2_0. Similarly, the second voltage supply block 520_1 may not supply the second voltage V2 to the second data line IO_1.

The detector 510 may detect the enabled write signal WT and enable the write detection signal WTS_BK (A22). The control signal generation unit 530 may disable the first control signal CTR1_0 in response to the enabled write detection signal WTS_BK (A23). The first precharge unit 550 may not supply the first voltage V1 to the first data line IO_0 in response to the disabled first control signal CTR1_0. Similarly, the second voltage supply block 520_1 may not supply the first voltage V1 to the second data line IO_1.

In summary, if the write signal WT is enabled, the precharge block 500 may not supply a voltage to the data lines IO_0 and IO_1. If a write operation is started, the precharge block 500 does not precharge the data lines IO_0 and IO_1, whereby the current consumption of the semiconductor apparatus 40 may be reduced.

The first column enable signal CASP<0> corresponding to the first memory bank 100_0 may be enabled. Further, data D3 may be transmitted through the first data line IO_0 and be stored in the first memory bank 100_0.

The detector 510 may continuously enable the write detection signal WTS_BK if the write signal WT is enabled within a predetermined time tCCD (for example, 4 cycles of the clock signal CLK) from when the write signal WT is enabled. The first voltage supply block 520_0 and the second voltage supply block 520_1 may continuously not supply a voltage to the first and second data lines IO_0 and IO_1.

The second column enable signal CASP<1> corresponding to the second memory bank 100_1 may be enabled, and data D4 may be transmitted through the second data line IO_1 and be stored in the second memory bank 100_1.

The detector 510 may disable the write detection signal WTS_BK if the write signal WT is not enabled again within the predetermined time tCCD from when the write signal WT is enabled second.

The control signal generation unit 530 may enable the first control signal CTR1_0 in response to the disabled write detection signal WTS_BK (A24). The first precharge unit 550 may supply the first voltage V1 to the first data line IO_0 in response to the enabled first control signal CTR1_0 (A25). Similarly, the second voltage supply block 520_1 may supply the first voltage V1 to the second data line IO_1.

In summary, if the enable periods of the write signal WT are not consecutively generated, the precharge block 500 may substantially simultaneously precharge the data lines IO_0 and IO_1 (S1). As the precharge block 500 slightly precharges the first and second data lines IO_0 and IO_1 to the level of the first voltage V1, a drop in a voltage level by current leakage may be prevented.

The control signal generation unit 530 may enable the second control signal CTR2_0 in response to the write strobe signal WTS disabled as the read signal RD is enabled (A26). The second precharge unit 570 may supply the second voltage V2 to the first data line IO_0 in response to the enabled second control signal CTR2_0 (A27). Similarly, the second voltage supply block 520_1 may supply the second voltage V2 to the second data line IO_1.

The precharge block 500 may quickly precharge the first and second data lines IO_0 and IO_1 which have already been precharged to the level of the first voltage V1 to the level of the second voltage V2.

Figure 12:
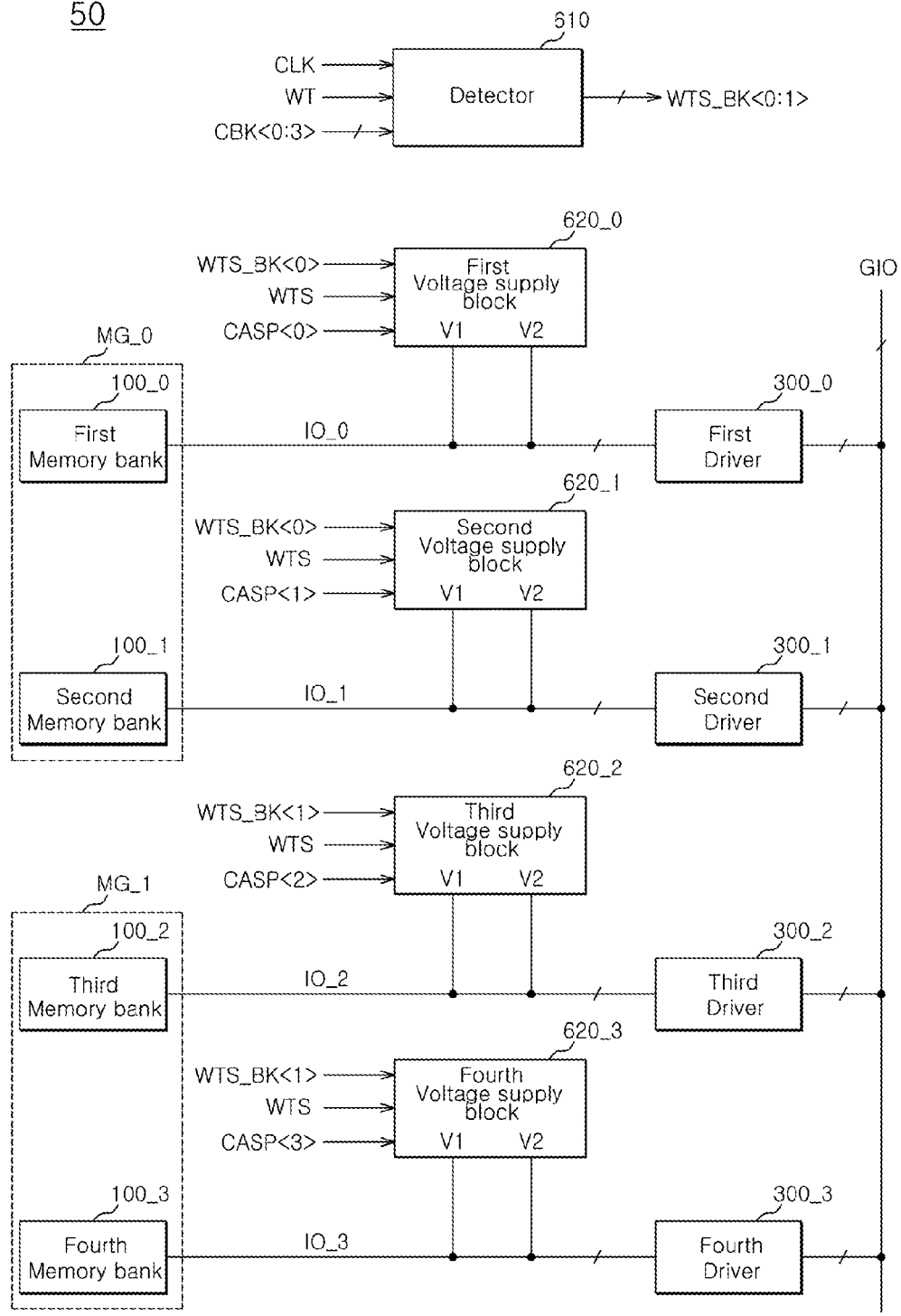
FIG. 12 is a block diagram schematically showing a semiconductor apparatus in accordance with an embodiment.

Referring to FIG. 12, a block diagram schematically showing a semiconductor apparatus 50 in accordance with an embodiment is shown.

The semiconductor apparatus 50 may include first to fourth memory banks 100_0 to 100_3, a detector 610, first to fourth voltage supply blocks 620_0 to 620_3, and first to fourth drivers 300_0 to 300_3.

The first to fourth memory banks 100_0 to 100_3 may be grouped and form bank groups MG_0 and MG_1. Where 2 memory banks form one bank group, for example, the first bank group MG_0 may include first and second memory banks 100_0 and 100_1. The number of memory banks to be grouped into one bank group is not limited to 2 as shown in FIG. 12.

If the enable period of a write signal WT is generated for a certain memory bank included in one bank group, the detector 610 may enable one write detection signal corresponding to the one bank group. For instance, if the enable period of the write signal WT is generated for the first memory bank 100_0 or the second memory bank 100_1, the detector 610 may enable a first write detection signal WTS_BK<0>. Also, since the voltage supply blocks 620_0 and 620_1 corresponding to the first bank group MG_0 are controlled by the common write detection signal WTS_BK<0> generated by the detector 610, supply of a voltage to first and second data lines IO_0 and IO_1 may be substantially simultaneously controlled. FIG. 12 also illustrates third and fourth data lines IO_2 and IO_3. Further, FIG. 12 also illustrates third and fourth column enable signals CASP<2> and CASP<3>.

The first to fourth voltage supply blocks 620_0 to 620_3, and the first to fourth drivers 300_0 to 300_3 may be configured and operate in substantially the same way as the first voltage supply block 520_0 and the first driver 300_0 of FIGS. 10 and 9. Accordingly, detailed descriptions will be omitted as a result.

Figure 13:
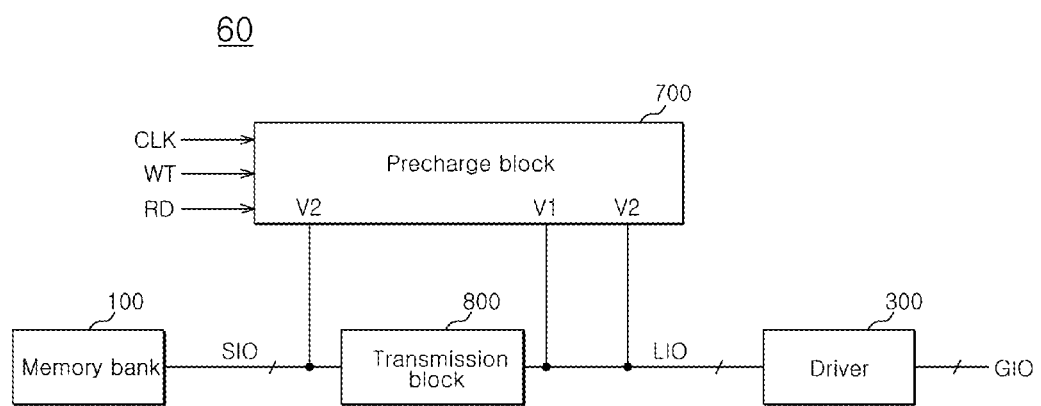
FIG. 13 is a block diagram schematically showing a semiconductor apparatus in accordance with an embodiment.

Referring to FIG. 13, a block diagram schematically showing a semiconductor apparatus 60 in accordance with an embodiment is shown.

In FIG. 13, the same reference numerals as in FIG. 1 will be used to refer to substantially the same component elements as the component elements of the semiconductor apparatus 10 described above with reference to FIG. 1.

The semiconductor apparatus 60 may include a memory bank 100, a precharge block 700, a driver 300, and a transmission block 800.

The memory bank 100 and the transmission block 800 may be electrically coupled with lower data lines SIO. The transmission block 800 and the driver 300 may be electrically coupled with intermediate data lines LIO. The precharge block 700 may be electrically coupled with the lower data lines SIO and the intermediate data lines LIO.

The precharge block 700 may perform a precharge operation for the lower data lines SIO and the intermediate data lines LIO, based on a clock signal CLK, a write signal WT and a read signal RD. The precharge block 700 may perform the precharge operation for the intermediate data lines LIO in substantially the same manner as the precharge block 200 of FIG. 1 performs the precharge operation for the at least one data line IO.

The precharge block 700 may not supply a voltage to the lower data lines SIO based on the write signal WT. The precharge block 700 may not supply a voltage or supply a first voltage V1 to the intermediate data lines LIO based on the write signal WT.

The precharge block 700 may monitor whether write operations are continuously performed for the memory bank 100, by referring to the write signal WT. Further, the precharge block 700 may perform the precharge operation according to a monitoring result. The precharge block 700 may not supply a voltage to the lower data lines SIO and the intermediate data lines LIO, based on a first enable period of the write signal WT. The precharge block 700 may continuously not supply a voltage to the lower data lines SIO and the intermediate data lines LIO where a second enable period of the write signal WT is generated within a predetermined time after the first enable period of the write signal WT is generated. Further, the precharge block 700 may supply the first voltage V1 to the intermediate data lines LIO where the second enable period is not generated.

The precharge block 700 may supply a second voltage V2 to the lower data lines SIO and the intermediate data lines LIO based on the read signal RD.

The transmission block 800 may electrically couple or not electrically couple the lower data lines SIO and the intermediate data lines LIO. The transmission block 800 may electrically couple the lower data lines SIO and the intermediate data lines LIO when the precharge block 700 supplies the first voltage V1 to the intermediate data lines LIO. The transmission block 800 may electrically couple the lower data lines SIO and the intermediate data lines LIO to transmit data.

Figure 14:
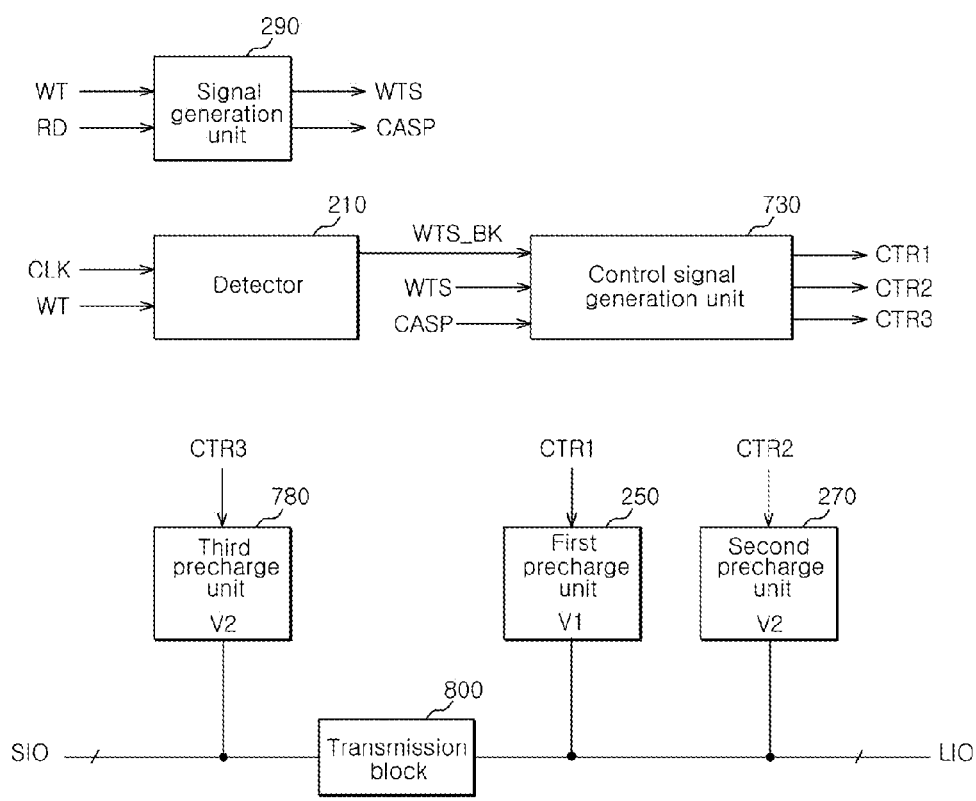
FIG. 14 is a block diagram schematically showing the precharge block shown in FIG. 13.

Referring to FIG. 14, a block diagram schematically showing the precharge block 700 shown in FIG. 13 is illustrated.

In FIG. 14, the same reference numerals as in FIG. 4 will be used to refer to substantially the same component elements as the component elements of the precharge block 200 described above with reference to FIG. 4.

The precharge block 700 may include a signal generation unit 290, a detector 210, a control signal generation unit 730, a first precharge unit 250, a second precharge unit 270, and a third precharge unit 780.

The control signal generation unit 730 may generate first and second control signals CTR1 and CTR2 in substantially the same way as the control signal generation unit 230 of FIG. 4. The control signal generation unit 730 may generate a third control signal CTR3 in response to a write detection signal WTS_BK, a write strobe signal WTS and a column enable signal CASP.

The control signal generation unit 730 may output the second and third control signals CTR2 and CTR3 which are disabled, according to the write strobe signal WTS which is enabled. Further, the control signal generation unit 730 may output the second and third control signals CTR2 and CTR3 which are enabled, in response to the write strobe signal WTS which is disabled. The control signal generation unit 730 may output the first control signal CTR1 which is disabled, in response to the write detection signal WTS_BK which is enabled. In addition, the control signal generation unit 730 may output the first control signal CTR1 which is enabled, in response to the write detection signal WTS_BK which is disabled. The control signal generation unit 730 may output the first to third control signals CTR1, CTR2 and CTR3 which are disabled, in response to the column enable signal CASP which is enabled.

The first precharge unit 250 may supply the first voltage V1 to the intermediate data lines LIO in response to the first control signal CTR1.

The second precharge unit 270 may supply the second voltage V2 to the intermediate data lines LIO in response to the second control signal CTR2.

The third precharge unit 780 may supply the second voltage V2 to the lower data lines SIO in response to the third control signal CTR3. The third precharge unit 780 may be configured in substantially the same way as the second precharge unit 270.

Figure 15:
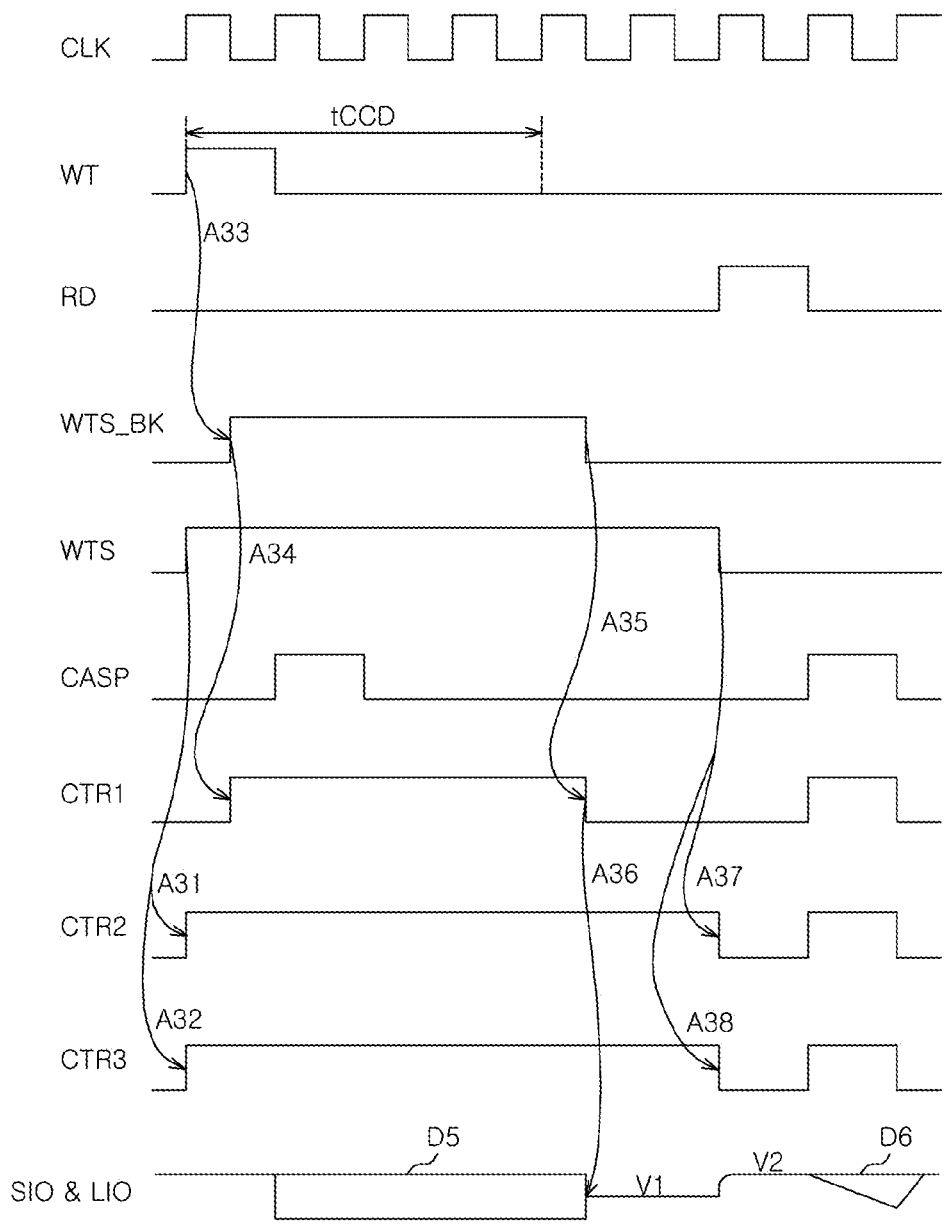
FIG. 15 is a timing diagram explaining the operation method of the semiconductor apparatus shown in FIG. 13.

Referring to FIG. 15, a timing diagram explaining the operation method of the semiconductor apparatus 60 shown in FIG. 13 is shown.

Hereinbelow, the operation method of the semiconductor apparatus 60 will be described in detail with reference to FIGS. 13 to 15.

The control signal generation unit 730 may disable the second and third control signals CTR2 and CTR3 in response to the write strobe signal WTS enabled as the write signal WT is enabled (A31 and A32). The second and third precharge units 270 and 780 may not supply the second voltage V2 to the intermediate data lines LIO and the lower data lines SIO in response to the disabled second and third control signals CTR2 and CTR3.

The detector 210 may detect the enabled write signal WT and enable the write detection signal WTS_BK (A33). The control signal generation unit 730 may disable the first control signal CTR1 in response to the enabled write detection signal WTS_BK (A34). The first precharge unit 250 may not supply the first voltage V1 to the intermediate data lines LIO in response to the disabled first control signal CTR1.

The column enable signal CASP may be enabled, and data D5 may be transmitted through the intermediate data lines LIO and the lower data lines SIO and be stored in the memory bank 100.

The detector 210 may disable the write detection signal WTS_BK if the write signal WT is not enabled again within a predetermined time tCCD (for example, 4 cycles of the clock signal CLK) from when the write signal WT is enabled.

The control signal generation unit 730 may enable the first control signal CTR1 according to the disabled write detection signal WTS_BK (A35). The first precharge unit 250 may supply the first voltage V1 to the intermediate data lines LIO in response to the enabled first control signal CTR1 (A36). When the first precharge unit 250 supplies the first voltage V1 to the intermediate data lines LIO, the transmission block 800 may electrically couple the lower data lines SIO and the intermediate data lines LIO. In addition, the lower data lines SIO and the intermediate data lines LIO may be precharged with the first voltage V1.

The control signal generation unit 730 may enable the second and third control signals CTR2 and CTR3 in response to the write strobe signal WTS which is disabled as the read signal RD is enabled (A37 and A38). The second and third precharge units 270 and 780 may supply the second voltage V2 to the intermediate data lines LIO and the lower data lines SIO in response to the enabled second and third control signals CTR2 and CTR3.

The control signal generation unit 730 may disable the first to third control signals CTR1, CTR2 and CTR3 in response to the column enable signal CASP which is enabled. The lower data lines SIO and the intermediate data lines LIO precharged to the level of the second voltage V2 may transmit data D6 read from the memory bank 100.

Figure 16:
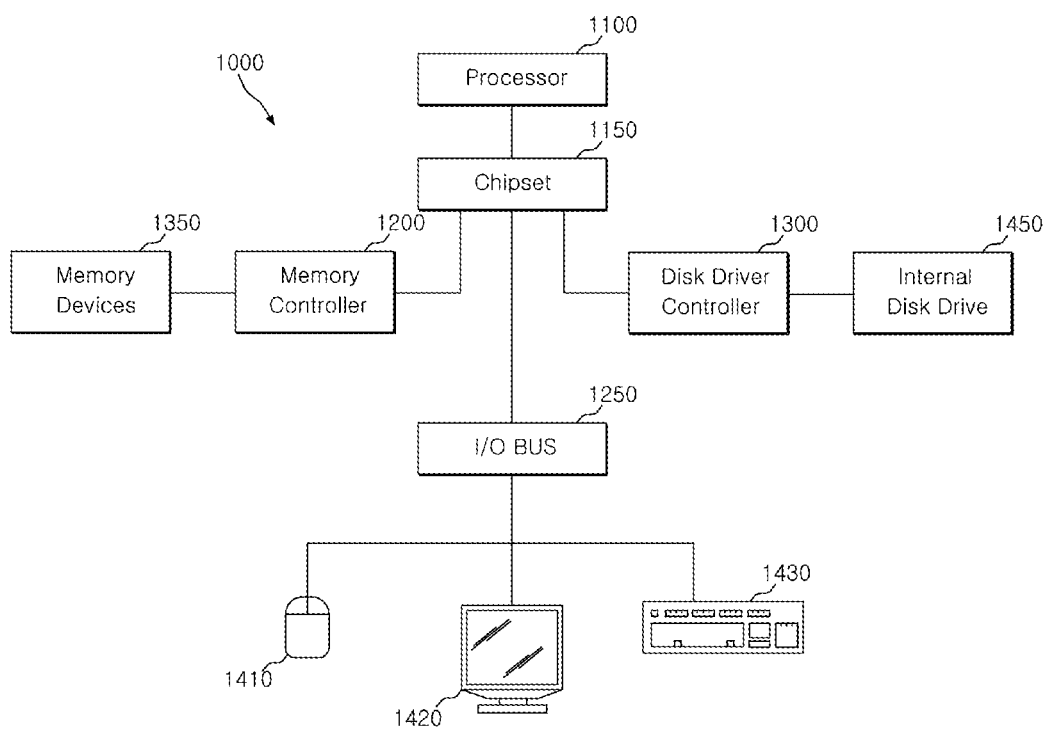
FIG. 16 illustrates a block diagram of a system employing a memory controller circuit in accordance with an embodiment of the invention.

Referring to FIG. 16, a system 1000 may include one or more processors 1100. The processor 1100 may be used individually or in combination with other processors. A chipset 1150 may be operably electrically coupled to the processor 1100. The chipset 1150 is a communication pathway for signals between the processor 1100 and other components of the system 1000. Other components may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be operably electrically coupled to the chipset 1150. The memory controller 1200 can receive a request provided from the processor 1100 through the chipset 1150. The memory controller 1200 may be operably electrically coupled to one or more memory devices 1350. The memory device 1350 may include the semiconductor apparatus described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420 or a keyboard 1430. The I/O bus 1250 may employ any one of a number of communications protocols to communicate with the I/O devices 1410, 1420 and 1430.

The disk drive controller 1300 may also be operably electrically coupled to the chipset 1150. The disk drive controller 1300 may serve as the communication pathway between the chipset 1150 and one or more internal disk drives 1450. The disk drive controller 1300 and the internal disk drives 1450 may communicate with each other or with the chipset 1150 using virtually any type of communication protocol.

As is apparent from the above descriptions, in the semiconductor apparatus according to the embodiments, it is possible to reduce an amount of current consumed to precharge a data line.

While various embodiments have been described above, it will be understood to those skilled in the art that the embodiments described are by way of example only. Accordingly, the semiconductor apparatus described herein should not be limited based on the described embodiments.

What is claimed is:

1. A semiconductor apparatus comprising:
   a first memory bank configured to store data transmitted through a first data line; and
   a precharge block configured to not supply a voltage or supply a first voltage to the first data line based on a write signal,
   wherein the precharge block comprises a detector configured to enable a write detection signal when a first enable period of a write signal is generated, until a predetermined time later after the first enable period is generated and keep enabling the write detection signal when a second enable period of the write signal is generated within the predetermined time after the first enable period is generated, until the predetermined time later after the second enable period is generated,
   wherein the precharge block interrupts a voltage supply to the first data line based on the write detection signal which is enabled so that the first data line is not precharged during the interruption of the voltage supply.

2. The semiconductor apparatus according to claim 1,
wherein the detector disables the write detection signal when the second enable period of the write signal is not generated within the predetermined time after the first enable period is generated, and
wherein the precharge block supplies the first voltage to the first data line based on the write detection signal which is disabled.

3. The semiconductor apparatus according to claim 1, wherein the precharge block comprises the detector configured to monitor whether the first enable period and the second enable period of the write signal are generated.

4. The semiconductor apparatus according to claim 1, further comprising:
a driver configured to transmit the data to the first data line, based on the write signal.

5. The semiconductor apparatus according to claim 1, further comprising:
a second memory bank configured to store data transmitted through a second data line,
wherein the precharge block monitors whether write operations are continuously performed for the first and second memory banks based on the write signal.

6. The semiconductor apparatus according to claim 5, wherein the precharge block does not supply a voltage, or supplies the first voltage to the first and second data lines according to a monitoring result.

7. The semiconductor apparatus according to claim 1,
wherein the precharge block supplies a second voltage to the first data line based on a read signal, and
wherein a level of the second voltage is higher than a level of the first voltage.

8. The semiconductor apparatus according to claim 7, wherein the precharge block comprises:
a first precharge unit configured to precharge the first data line to the level of the first voltage; and
a second precharge unit configured to precharge the first data line to the level of the second voltage.

9. The semiconductor apparatus according to claim 8, wherein the first precharge unit includes a voltage dropping section configured to be applied with the second voltage and output the first voltage.

10. A semiconductor apparatus comprising:
a first memory bank configured to store data transmitted through a first data line;
a precharge block configured to precharge the first data line to a level of a first voltage or a second voltage; and
a lower data line electrically coupled between the first memory bank and the first data line,
wherein the precharge block does not supply a voltage or supplies the first voltage to the first data line and does not supply the voltage to the lower data line, based on a write signal, and supplies the second voltage to the first data line and the lower data line, based on a read signal.

11. The semiconductor apparatus according to claim 10, wherein, when the precharge block supplies the first voltage to the first data line, the first data line and the lower data line are electrically coupled.

12. The semiconductor apparatus according to claim 10, wherein the precharge block does not supply the voltage to the first data line, based on a first enable period of the write signal, and supplies the first voltage to the first data line where a second enable period of the write signal is not generated within a predetermined time after the first enable period is generated.

13. The semiconductor apparatus according to claim 12, wherein the precharge block does not supply the voltage to the first data line where the second enable period is generated within the predetermined time.

14. The semiconductor apparatus according to claim 12, wherein the precharge block comprises a detector configured to monitor whether the first enable period and the second enable period of the write signal are generated.

15. The semiconductor apparatus according to claim 10, further comprising:
a second memory bank configured to store data transmitted through a second data line,
wherein the precharge block monitors whether write operations are continuously performed for the first and second memory banks.

* * * * *